United States Patent
Grimanis et al.

(10) Patent No.: US 9,838,788 B1
(45) Date of Patent: Dec. 5, 2017

(54) ASSEMBLY FOR PREVENTING PHASE ERROR

(71) Applicant: Tymphany HK Limited, Wanchai (HK)

(72) Inventors: Dimitris Grimanis, Athens (GR); Jason Anthony Greenslade, Wanchai (HK)

(73) Assignee: TYMPHANY HK LIMITED, Wanchai (HK)

( * ) Notice: Subject to any disclaimer, the term of this patent is extended or adjusted under 35 U.S.C. 154(b) by 0 days.

(21) Appl. No.: 15/369,362

(22) Filed: Dec. 5, 2016

(51) Int. Cl.
*H04R 3/14* (2006.01)
*H03K 5/1252* (2006.01)

(52) U.S. Cl.
CPC ............. *H04R 3/14* (2013.01); *H03K 5/1252* (2013.01)

(58) Field of Classification Search
CPC ............ H03C 1/52; H04R 3/005; H04S 1/002
See application file for complete search history.

(56) References Cited

U.S. PATENT DOCUMENTS

| | | | | |
|---|---|---|---|---|
| 5,796,844 A | * | 8/1998 | Griesinger | H04S 5/005 381/18 |
| 5,870,480 A | * | 2/1999 | Griesinger | H04S 3/02 381/18 |
| 9,706,297 B2 | * | 7/2017 | Chang | H04R 3/005 |
| 2003/0133518 A1 | * | 7/2003 | Koomullil | H04L 25/061 375/326 |
| 2011/0293111 A1 | * | 12/2011 | Chang | H04R 3/005 381/97 |

* cited by examiner

*Primary Examiner* — Mohammad Islam
(74) *Attorney, Agent, or Firm* — Cantor Colburn LLP

(57) ABSTRACT

An assembly configured to prevent phase error includes an input unit, a filter unit, a slicer unit, a subtraction unit and an addition unit. The input unit provides an original audio signal. The filter unit selects one part of an original audio signal according to a preset bandwidth setting on the filter unit to form a first audio signal, and outputs said audio signal from a second output terminal. The slicer unit analyzes the amplitude magnitude according to a preset threshold amplitude to form a second audio signal. The subtraction unit subtracts the first audio signal from the original audio signal to form a third audio signal. The second audio signal and the third audio signal have the same phase retardation. The addition unit adds the second audio signal and the third audio signal to form a fourth audio signal.

8 Claims, 3 Drawing Sheets

ASSEMBLY FOR PREVENTING PHASE ERROR

The present invention relates to audio signal processing techniques, and more specifically, to an audio system configured to compensate for various errors appearing in audio signals.

BACKGROUND

As shown in FIG. 1, a conventional technique uses crossover filter 1 to analyze audio signal X. The crossover filter 1 filters the audio signal X into two different band waves which is X1 and X2. A first wave X1 is transmitted to a slicer 2, and is output as filtered signal X3. A second wave X2 is output from the crossover filter and is combined with the first wave X1 via a summer 3 to generate an output signal (X2+X3). However, the crossover filter 1 can introduce a phase error. For example, a low-pass filter section of the crossover filter 1 can introduce a lagging phase shift with increasing frequency, while a high pass section of the crossover filter 1 can introduces a leading phase shift. There is also a phase error between the wave X1 and the audio signal X because wave X1 would be effected by slicer 2 as wave X1 being outputted from slicer 2 (namely wave X3). Also, there are some overlapped waves produced because of different phase error occurring between waves X2 and X3 while wave X2 is adding to wave X3. Thus, the audio signal X has distortion.

In view of this, the at least one non-limiting embodiment provides an assembly configured to prevent phase error to solve the lack of conventional techniques.

SUMMARY

Various non-limiting embodiments provide an assembly configured to prevent phase error to reach the purpose of preventing distortion by a filter unit, a slicer unit, a subtraction unit, and an addition unit.

The at least one embodiment provides an assembly configured to prevent phase error to reach the purpose of phase compensation through the multi-stage circuit to synchronize the phase retardation.

The at least one embodiment provides an assembly configured to prevent phase error is applied to compressor linear circuit or analog circuit phase retardation.

To reach above-mentioned purposes and others, the at least one non-limiting embodiment provides an assembly configured to prevent phase error comprising a filter unit, a slicer unit, a subtraction unit, and an addition unit. The input unit comprises a first input terminal and a first output terminal. The first input terminal is applied to receive an original audio signal. The filter unit comprises a second input terminal and a second output terminal. The second input terminal is connected to the first output terminal. There is a preset bandwidth setting on the filter unit. The filter unit selects one part of original audio signal according to the preset bandwidth to output a first audio signal from the second output terminal. The slicer unit comprises a third input terminal and a third output terminal. The third input terminal is connected to the second output terminal. There is a threshold amplitude setting on the slicer unit. The slicer unit forms a second audio signal by analyzing the first audio signal amplitude according to the threshold amplitude. The second audio signal is output from third output terminal. The subtraction unit comprises a fourth input terminal, fifth input terminal, and the fourth output terminal. The fourth input terminal is connected to the first input terminal, and the fifth input terminal is connected to the second output terminal respectively. The subtraction unit subtracts the first audio signal from the original signal to form a third audio signal which is outputted from the fourth output terminal. Both the third audio signal and the second audio signal have the same phase retardation. The addition unit comprises a sixth input terminal, seventh input terminal and fifth output terminal. The sixth input terminal is connected to the fourth output terminal, and the seventh input terminal is connected to the third output terminal. The addition unit adds the second audio signal and the third audio signal to form a fourth audio signal, and the fourth audio signal is outputted from the fifth output terminal. The fourth audio signal is equal to the original audio signal, and there is a phase error between them.

DETAILED DESCRIPTION

Figure 1:
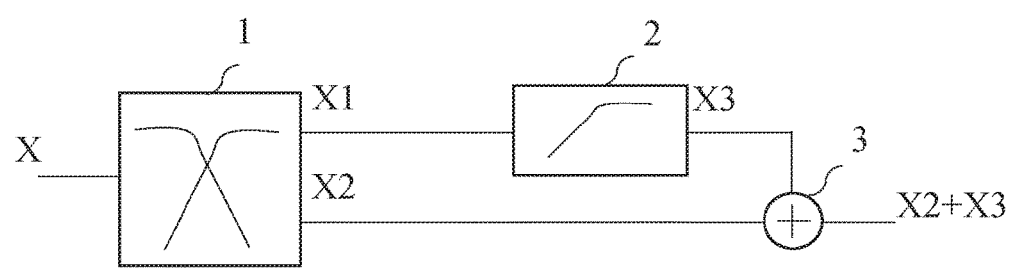
FIG. 1 is a conventional technique block diagram for preventing phase error assembly.

Various non-limiting embodiments will be described with reference to the drawing figures where like numerals represent like elements throughout.

Figure 2:
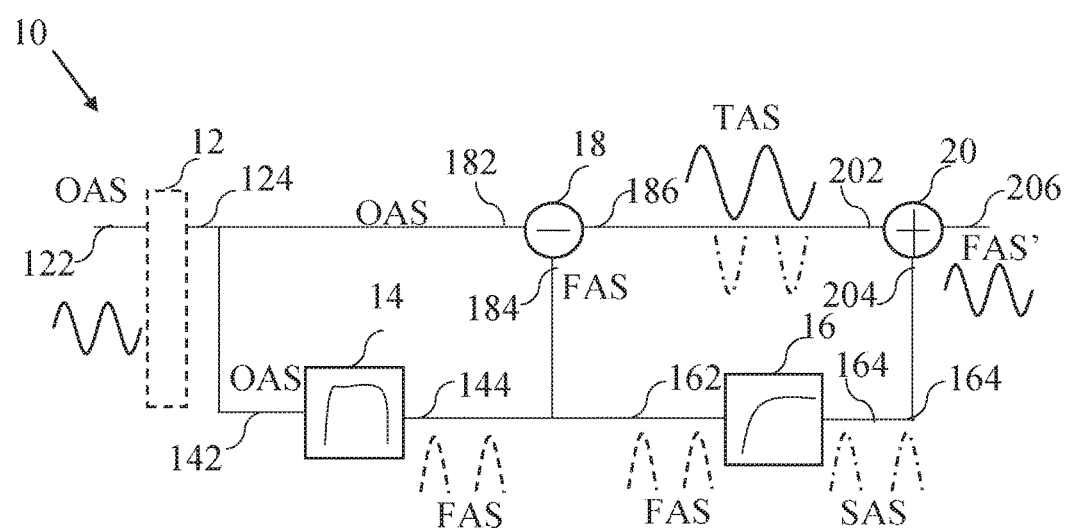
FIG. 2 is a block diagram illustrating an assembly configured to prevent phase error according to a first non-limiting embodiment.

FIG. 2 is a block diagram of an assembly 10 configured to prevent phase error according to a first non-limiting embodiment. The assembly 10 is configured to prevent the phase error can be implemented on phase compensation to reach the purpose of preventing distortion.

The assembly 10 comprises an input unit 12, a filter unit 14, a slicer unit 16, a subtraction unit 18, and an addition unit 20. In at least one embodiment, the slicer unit 16 may be constructed, for example, as a high-pass filter or a clipper circuit.

The input unit 12 comprises a first input terminal 122 and a first output terminal 124. The input unit 12 could be a conductive wire patterns, a terminal interface patterns, or others. The first input terminal 122 is capable of receiving an original audio signal (OAS). An example of the OAS waveform is further illustrated in FIG. 3. The illustration of the OAS is generated as a sine wave, for example, which includes positive half-wave and negative half-wave.

The filter unit 14 comprises a second input terminal 142 and a second output terminal 144. The filter unit 14 can be constructed as a filter circuit comprising at least two of a resistive element (not shown), a capacitive element (not shown), and an inductive element (not shown). The second input terminal 142 is connected to the first output terminal 124. There is a preset bandwidth in the filter unit 14. By adjusting the resistance of the resistive element, the capacitance of the capacitor, and the inductance of the inductive element, to determine the total impedance, the charging time, and the discharging time, the filter unit 14 has a preset bandwidth.

In at least one embodiment, the filter unit 14 includes at least one of a low pass filter (not shown), a band pass filter (not shown), and a high pass filter (not shown) according to its design. For example, the low pass filter r is configured to pass a low frequency waveform, the high pass filter is configured to pass a high frequency waveform, and the band pass filter is configured to pass a medium frequency waveform when the waveform comprises a low frequency, medium frequency, and high frequency.

Figure 3:
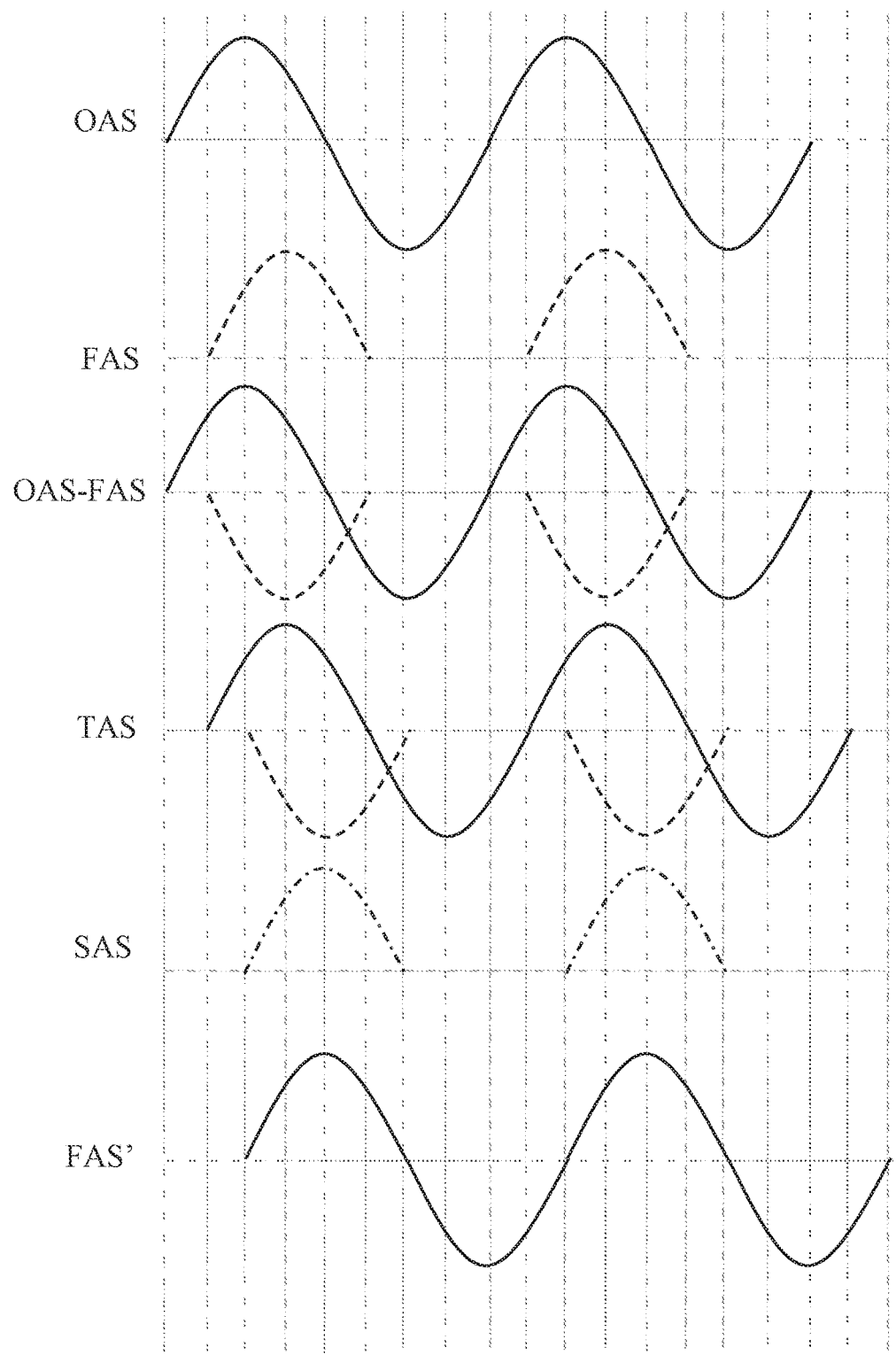
FIG. 3 depicts various waveforms generated by the assembly illustrated in FIG. 2.

The filter unit 14 selects one part of the original audio signal (OAS) according to the preset bandwidth, and outputs a first audio signal (FAS) from the second output terminal 144. In FIG. 3, the preset bandwidth of filter unit 14 selects to let the positive half-wave of the original audio signal OAS, namely the first audio signal FAS, passing through. Since it is possible to generate a phase change when the OAS is passing through the filter unit 14, for ease of explanation and further consideration of the phase change, it is set that there is a phase delay of first audio signal FAS comparing to the original audio signal OAS. The phase delay can be, for example, a multiple of 180 degrees.

The slicer unit 16, comprises a third input terminal 162 and third output terminal 164. The third input terminal 162 is connected to the second output terminal 144 to receive the FAS. There is a threshold amplitude preset in the slicer unit 16. For example, the FAS is limited to the threshold amplitude to avoid abnormal voltage (generally, the abnormal voltage has a higher amplitude) when the FAS amplitude is greater or equal to the threshold amplitude. The slicer unit 16 determines the outputting amplitude intensity of the FAS according to the threshold amplitude, forms a second audio signal (SAS). The third output terminal 164 outputs the SAS. In FIG. 3, the output wave of slicer unit 16 is a positive half-wave as well as the filter unit 14. However, considering aforesaid phase change situation, it is set that there is a phase error of the SAS with respect to the FAS. For example, a phase error being a multiple of 180 degrees, for example, can be introduced.

The subtraction unit 18 comprises a fourth input terminal 182, a fifth input terminal 184, and a fourth output terminal 186. The fourth input terminal 182 is connected to the first output terminal 124, and the fifth input terminal 184 is connected to the second output terminal 144. The subtraction unit 18 subtracts the FAS from the OAS to form a third audio signal (TAS). Considering the aforesaid phase change situation, it is set that there is a delay of the third audio signal TAS with respect to the second audio signal TAS. The phase delay can be, for example, a multiple of 180 degrees. There is something noticeable that the FAS may be reversed and changed to negative half-wave in the slicer unit 16, and further be added to the OAS, so that it may accomplish the feature of subtracting the FAS from the OAS. The TAS is output from the fourth output terminal 186.

The addition unit 20 comprises a sixth input terminal 202, a seventh input terminal 204, and a fifth output terminal 206. The sixth input terminal 202 is connected to the fourth output terminal 186, and the seventh output terminal 204 is connected to the third output terminal 164. The addition unit 20 adds the SAS and the TAS to form a fourth audio signal (FAS'). There is something noticeable that both the SAS and the TAS have the same phase shift, and the positive half-wave of the SAS is the same as the negative half-wave of the TAS. Therefore, during the adding process, the positive half-wave and the negative half-wave wipe one another out (i.e., cancel out each other) and then restore to the OAS, namely the fourth audio signal FAS'. The fifth output terminal 206 outputs the FAS' where the FAS' is equal to the OAS. In at least one embodiment there is a phase shift between the FAS' and the OAS. The phase shift between can be about 90-degrees, for example.

The subtraction unit 18 and the addition unit 20 include of an operational amplifier (not shown) and at least one of a resistive element (not shown), a capacitive element (not shown), and inductance element (not shown), respectively.

In at least one embodiment, the number of the filter unit 14 and the slicer unit 16 is just an example. In other embodiment, the number of the filter unit 14 and the slicer unit 16 could be plural.

What is claimed is:

1. An assembly configured to prevent phase error, the assembly comprising:
   an input unit with a first input terminal configured to receive an original audio signal, and a first output terminal;
   a filter unit with a second input terminal and a second output terminal, the second input terminal connected to said first output terminal, said filter unit choosing one part of said original audio signal according to a preset bandwidth setting to output a first audio signal from said second output terminal;
   a slicer unit with a third input terminal and a third output terminal, the third input unit connected to said second output terminal, said slicer unit configured to analyze an amplitude magnitude according to a preset threshold amplitude to form a second audio signal and to output said second audio signal from said third output terminal;
   a subtraction unit with a fourth input terminal connected to said first output terminal, a fifth input terminal connected to said second output terminal, and a fourth output terminal, said subtraction unit configured to subtract said first audio signal from said original audio signal to form a third audio signal, wherein said second audio signal and said third audio signal have a same phase retardation; and
   an addition unit with a sixth input terminal connected to said fourth output terminal, a seventh input terminal connected to said third output terminal, and a fifth output terminal, said addition unit adding said second audio signal and said third audio signal to form a fourth audio signal that is output from said fifth output terminal, wherein said fourth audio signal is equal to said original audio signal and having a phase aberration in between.

2. The assembly configured to prevent phase error according to claim 1, wherein an amplitude of said first audio signal is no less than said preset threshold amplitude.

3. The assembly configured to prevent phase error according to claim 1, wherein said filter unit is at least one of a low pass filter, a band pass filter, and a high pass filter.

4. The assembly configured to prevent error according to claim 1, wherein said filter unit is a filter circuit comprising at least two of a resistive element, a capacitive element, and an inductive element.

5. The assembly configured to prevent phase error according to claim 2, wherein said filter circuit sets the preset bandwidth setting.

6. The assembly configured to prevent phase error according to claim 1, wherein said slicer unit is a slicer circuit comprising at least two of a resistive element, a capacitive element and an inductive element.

7. The assembly configured to prevent phase error according to claim 6, wherein said slicer circuit sets the preset threshold amplitude.

8. The assembly configured to prevent phase error according to claim 1, wherein said subtraction unit and said addition unit both comprise an operational amplifier and at least one of a resistive element, a capacitive element and an inductive element.

* * * * *